United States Patent
Xi et al.

(10) Patent No.: US 9,276,045 B2
(45) Date of Patent: Mar. 1, 2016

(54) DISPLAY PANEL

(71) Applicant: Au Optronics Corporation, Hsinchu (TW)

(72) Inventors: Peng-Bo Xi, Taipei (TW); Ya-Ling Hsu, New Taipei (TW)

(73) Assignee: Au Optronics Corporation, Hsinchu (TW)

( * ) Notice: Subject to any disclaimer, the term of this patent is extended or adjusted under 35 U.S.C. 154(b) by 40 days.

(21) Appl. No.: 14/191,465

(22) Filed: Feb. 27, 2014

(65) Prior Publication Data

US 2015/0123083 A1 May 7, 2015

(30) Foreign Application Priority Data

Nov. 1, 2013 (TW) .............................. 102139738 A

(51) Int. Cl.
| | |
|---|---|
| H01L 27/32 | (2006.01) |
| G09G 5/02 | (2006.01) |
| G02F 1/1335 | (2006.01) |
| G09G 3/36 | (2006.01) |
| H01L 51/52 | (2006.01) |

(52) U.S. Cl.
CPC ........ *H01L 27/322* (2013.01); *G02F 1/133514* (2013.01); *G09G 3/3611* (2013.01); *G09G 5/02* (2013.01); *G09G 2300/0452* (2013.01); *H01L 51/5265* (2013.01)

(58) Field of Classification Search
CPC combination set(s) only.
See application file for complete search history.

(56) References Cited

U.S. PATENT DOCUMENTS

| | | | |
|---|---|---|---|
| 7,701,476 B2 | 4/2010 | Brown Elliott et al. | |
| 2005/0237447 A1 | 10/2005 | Ono | |
| 2008/0084376 A1* | 4/2008 | Hirota | G09G 3/3607 345/88 |
| 2010/0053038 A1* | 3/2010 | Sakamoto | H01L 51/5265 345/76 |
| 2010/0315377 A1 | 12/2010 | Chang et al. | |
| 2013/0050282 A1* | 2/2013 | Kim | G09G 3/3413 345/690 |

FOREIGN PATENT DOCUMENTS

| | | |
|---|---|---|
| CN | 1862647 | 11/2006 |
| CN | 101409065 | 4/2009 |
| CN | 102162950 A | 8/2011 |
| CN | 102914923 A | 2/2013 |
| CN | 103257487 A | 8/2013 |
| EP | 1875505 | 1/2008 |
| TW | 201101276 | 1/2011 |
| TW | 201236002 | 9/2012 |

* cited by examiner

*Primary Examiner* — Kyoung Lee
*Assistant Examiner* — Ratisha Mehta
(74) *Attorney, Agent, or Firm* — Jiang Chyun IP Office

(57) ABSTRACT

A display panel has first and second unit regions staggered to each other and includes a pixel array layer and a color filter layer. The pixel array layer includes white organic light emitting units generating a white light. The color filter layer includes red, green and blue filter patterns and first and second white filter patterns. A first white light CIE color coordinate of the white light passing through the first white filter patterns is different from a second white light CIE color coordinate of the white light passing through the second white filter patterns. Each first unit region has one red filter pattern, one green filter pattern, one blue filter pattern, and one first white filter pattern disposed therein, and each second unit region has one red filter pattern, one green filter pattern, one blue filter pattern, and one second white filter pattern disposed therein.

23 Claims, 9 Drawing Sheets

DISPLAY PANEL

CROSS-REFERENCE TO RELATED APPLICATION

This application claims the priority benefit of Taiwan application serial no. 102139738, filed on Nov. 1, 2013. The entirety of the above-mentioned patent application is hereby incorporated by reference herein and made a part of this specification.

BACKGROUND OF THE INVENTION

1. Technical Field

The invention generally relates to a display panel, and more particularly to a color filter layer of the display panel.

2. Description of Related Art

As the technology advances, bulky Cathode Ray Tube (CRT) displays have gradually become history. Therefore, displays such as Liquid Crystal Display (LCD), Organic Light Emitting Diode display (OLED display), Electro-Phoretic Display (EPD), and Plasma Display Panel (PDP) have gradually become the mainstream for future displays. The structure using white light OLED as a light source along with a color filter layer containing three primary colors RGB is one of the full-color technologies commonly used in the OLED display panel nowadays. Since the white light OLED has poor luminous efficiency and yields difficulty to comply with the perfect white point coordinate, the structural design is commonly required to use color matching or extra color filter layer to balance the white point chromaticity. As a result, the problem of high power consumption would occur.

SUMMARY

The invention provides a display panel, which includes a plurality of first unit regions and a plurality of second unit regions, wherein the first unit regions and the second unit regions are staggered to each other. The display panel includes a pixel array layer and a color filter layer. The pixel array layer includes a plurality of white organic light emitting units which generate a while light. The color filter layer is located on the pixel array layer, and the color filter layer includes a plurality of red filer patterns, a plurality of green filter patterns, a plurality of blue filter patterns, a plurality of first white filter patterns, and a plurality of second white filter patterns disposed corresponding to the pixel array layer. A first white light CIE color coordinate of the white light which passes through the first white filter pattern is different from a second white light CIE color coordinate of the white light which passes through the second white filter pattern. Each of the first unit regions has one red filter pattern, one green filter pattern, one blue filter pattern, and one first white filter pattern disposed therein, and each of the second unit regions has one red filter pattern, one green filter pattern, one blue filter pattern, and one second white filter pattern disposed therein.

The invention further provides a display panel, which includes a plurality of first unit regions and a plurality of second unit regions, wherein the first unit regions and the second unit regions are staggered to each other. The display panel includes a light source, a pixel array layer, and a color filter layer. The light source displays a white light. The pixel array layer is disposed on the light source. The color filter layer is located on the pixel array layer, and the color filter layer includes a plurality of red filer patterns, a plurality of green filter patterns, a plurality of blue filter patterns, a plurality of first white filter patterns, and a plurality of second white filter patterns disposed corresponding to the pixel array layer. A first white light CIE color coordinate of the white light which passes through the first white filter pattern is different from a second white light CIE color coordinate of the white light which passes through the second white filter pattern. Each of the first unit regions has one red filter pattern, one green filter pattern, one blue filter pattern, and one first white filter pattern disposed therein, and each of the second unit regions has one red filter pattern, one green filter pattern, one blue filter pattern, and one second white filter pattern disposed therein.

Accordingly, since the display provided in the invention has the first and the second white filter patterns including different white light CIE color coordinates and five types of color filter patterns including three primary colors RGB, the display would yield high luminous efficiency in the unsaturated color interval to further achieve the effect of power saving.

To make the above features and advantages of the invention more comprehensible, several embodiments accompanied with drawings are described in detail as follows.

DESCRIPTION OF THE EMBODIMENTS

Figure 1:
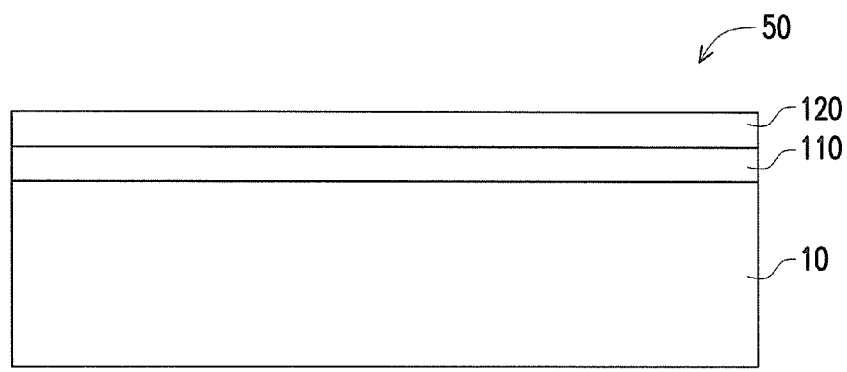
FIG. 1 is a schematic cross-sectional view of a display panel according to an embodiment of the invention.
Figure 2:
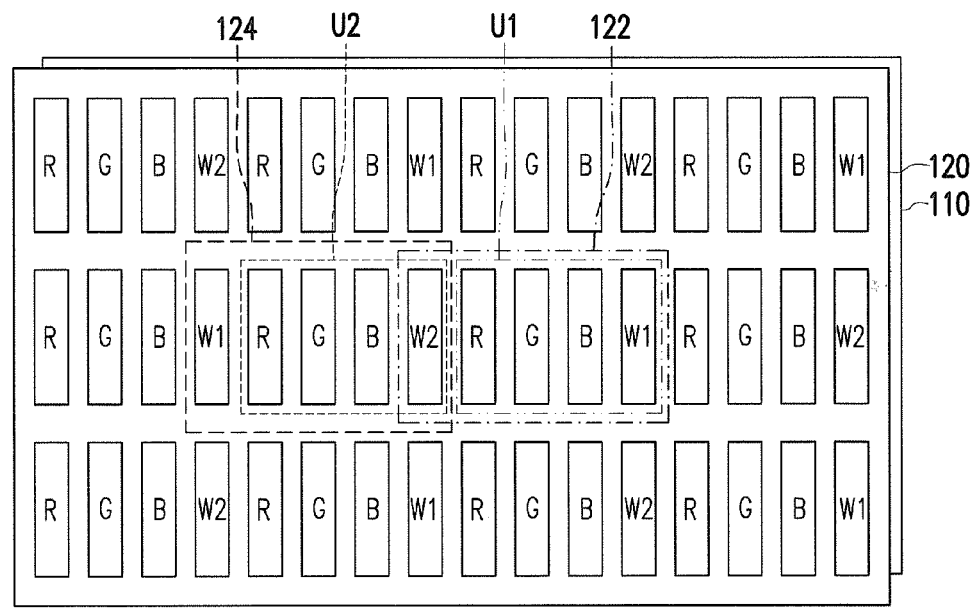
FIG. 2 is a schematic top view of the display panel shown in FIG. 1.
Figure 3A:
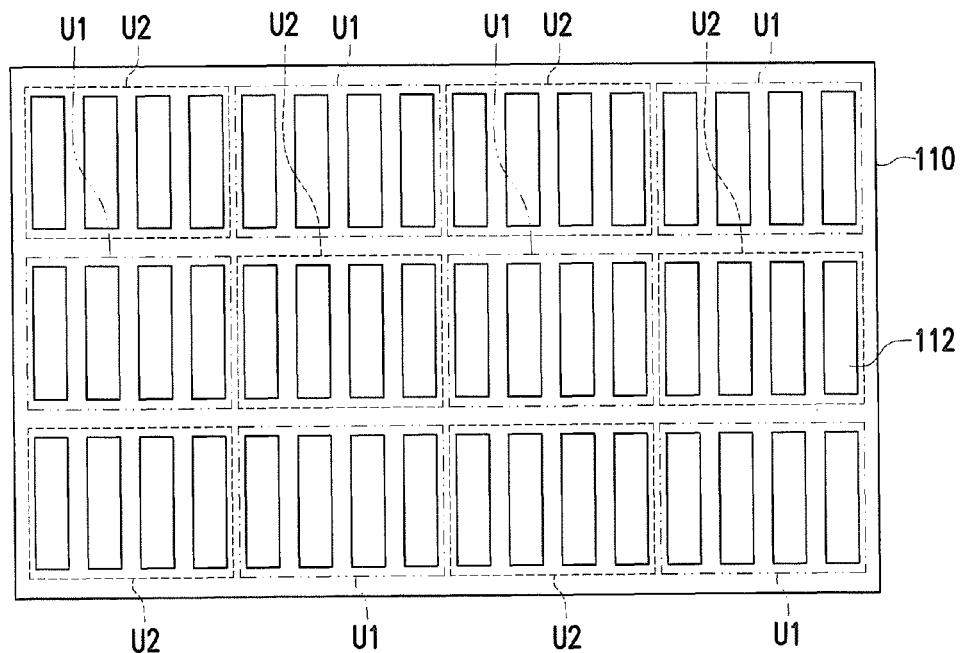
FIG. 3A is a schematic top view of a pixel array layer according to first embodiment of the invention.
Figure 3B:
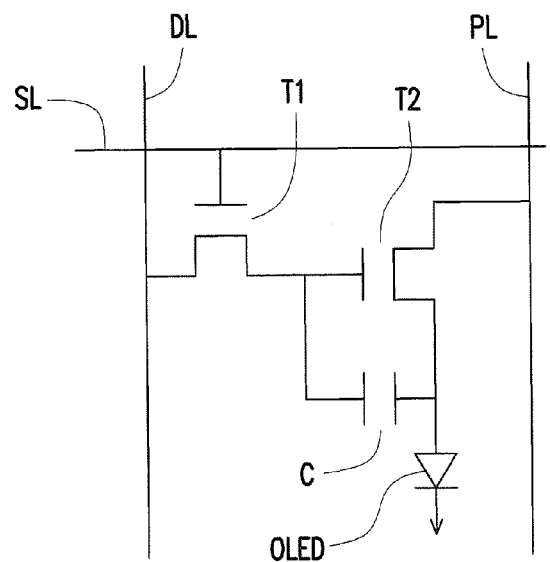
FIG. 3B is an equivalent circuit diagram of a light emitting unit in the pixel array layer shown in FIG. 3A.

FIG. 1 is a schematic cross-sectional view of a display panel according to an embodiment of the invention and FIG. 2 is a schematic top view of the display panel shown in FIG. 1. FIG. 3A and FIG. 3B are respectively a schematic top view of a pixel array and an equivalent circuit diagram of a light emitting unit in the pixel array layer according to first embodiment of the invention.

Please refer to FIG. 1, FIG. 2, FIG. 3A, and FIG. 3B simultaneously, the display panel 50 is, for example, a self-illuminating display panel. In the present embodiment, an OLED display panel (namely, Organic Electro-luminescence Display panel, OELD panel) is used as an example of the display panel 50 for demonstration. The display panel 50 includes a substrate 10, a pixel array layer 110, and a color filter layer 120.

The material of the substrate 10 includes glass, quartz, organic polymer, metal, or the like.

The pixel array layer 110 is located on the substrate 10, and the pixel array layer 110 includes a plurality of white organic light emitting units 112 which generates a white light. In other words, the pixel array layer 110 is formed by a plurality of white organic light emitting units 112, and the pixel array layer 110 can be utilized to provide a white light source. In the present embodiment, the white organic light emitting units 112 are, for example, pixel structures of active matrix organic light emitting diode display panel.

FIG. 3B is an equivalent circuit diagram of a light emitting unit (namely, the white organic light emitting unit 112) in the pixel array layer 110 shown in FIG. 3A. According to an embodiment of the invention, the pixel array layer 110 further includes a plurality of scan lines SL, a plurality of data lines DL, and a plurality of power lines PL, wherein each of the white organic light emitting units 112 is electrically connected to a corresponding scan line SL, a corresponding data line DL, and a corresponding power line PL. More specifically, each of the white organic light emitting units 112 of the pixel array layer 110 includes at least one active device T1, T2, a capacitor C, and an organic light emitting device OLED which is electrically connected to the active device T2. The active device T1 is electrically connected to the scan lines SL and the data lines DL, the active device T2 is electrically connected to the active device T1 and the power lines PL, the capacitor C is electrically connected to active devices T1, T2, and the organic light emitting device OLED is electrically connected to the capacitor C and the active device T2. Among these components, at least one of the active devices T1, T2, the capacitor C, and organic light emitting device OLED can be the structure known to people having ordinary skill in the art and are not described herein. In the present embodiment, each of the white organic light emitting units 112 uses two active devices along with one capacitor (2T1C) as an example for explanation, but it construes no limitation in the invention. The numbers of the active devices and the capacitors in each of the white organic light emitting units 112 are not limited in the invention.

The color filter layer 120 is located on the pixel array layer 110, and the color filter layer 120 includes a plurality of red filter patterns R, a plurality of green filter patterns G, a plurality of blue filter patterns B, a plurality of first white filter patterns W1, and a plurality of second white filter patterns W2 disposed corresponding to the plurality of white organic light emitting units 112 of the pixel array layer 110. The material of the red filter patterns R, the green filter patterns G, the blue filter patterns B, the first filter patterns W1, and the second white filter patterns W2 are, for example, resin or other suitable light transmissive materials. The material of these filter patterns can be similar, for example, the red filter patterns R, the green filter patterns G, and the blue filter patterns B can be manufactured by dye-doped photoresists, and the first white (or transparent) filter patterns W1 and the second white filter (or transparent) patterns W2 can be manufactured by non-dye-doped transparent photoresists. However, it construes no limitation in the invention, and the material of theses filter patterns can be different as well. In the present embodiment, the preferable material of the first white filter patterns W1 includes transparent material, and the preferable material of the second white filter patterns W2 includes yellow light absorbing material (namely, the material which appears as light blue and the chromaticity would shift toward the high color temperature direction).

Moreover, the color filter layer 120 can further include a light shielding pattern (not illustrated), which is also known as a black matrix. The light shielding pattern is disposed between the red filter patterns R, the green filter patterns G, the blue filter patterns B, the first white filter patterns W1, and the second white filter patterns W2 of the color filter layer 120 to define these filter patterns respectively. The material of the light shielding pattern is, for example, black resin or other suitable light shielding material.

In addition, the display panel 50 can further include an overcoat layer (not illustrated) or a cover plate (not illustrated). The overcoat layer or the cover plate is covered on the color filter layer 120 to protect the elements of the display panel 50 from being damaged during the subsequent assembling or moving process and to serve as a barrier to prevent water vapour, oxygen, or other contaminants to permeate. The material of the overcoat layer is, for example, silicon oxide, silicon nitride, silicon oxynitride, or other suitable material. The material of the cover plate is, for example, glass, plastic, metal, or the like. In the present embodiment, the preferable material of the overcoat layer or the cover is transparent material.

The designs and arrangements of the five types of color filter patterns (the red filter patterns R, the green filter patterns G, the blue filter patterns B, the first white filter patterns W1, and the second white filter patterns W2) of the color filter layer 120 will be described in detail in the following paragraphs.

Please refer to FIG. 2 and FIG. 3A. The display panel 50 includes a plurality of first unit regions U1 and a plurality of second unit regions U2, wherein the first unit regions U1 and the second unit regions U2 are staggered to each other. Each of the first unit regions U1 has one red filter pattern R, one green filter pattern G, one blue filter pattern B, and one first white filter pattern W1 disposed therein, and each of the second unit regions U2 has one red filter pattern R, one green filter pattern G, one blue filter pattern B, and one second white filter pattern W2 disposed therein.

In the present embodiment, the red filter pattern R, the green filter pattern G, the blue filter pattern B, and the first white filter pattern W1 in each of the first unit regions U1 are arranged in the form of single row with multiple columns, and the red filter pattern R, the green filter pattern G, the blue filter pattern B, and the second white filter pattern W2 in each of the second unit regions U2 are arranged in the form of single row with multiple columns. The red filter pattern R, the green filter pattern G, the blue filter pattern B, the first white filter pattern W1, and the second white filter pattern W2 are arranged, for example, in the form of strip, and the shapes of these filter patterns are, for example, rectangle, square, oblong, or other suitable shapes.

Moreover, in the present embodiment, the red filter pattern R, the green filter pattern G, the blue filter pattern B, and the first white filter pattern W1 in each of the first unit regions U1 and an adjacent second white filter pattern W2 in the second unit regions U2 form a display pixel unit 122, and the red filter pattern R, the green filter pattern G, the blue filter pattern B, and the second white filter pattern W2 in each of the second unit regions U2 and an adjacent first white filter pattern W1 in the first unit regions U1 form another display pixel unit 124. In other words, the display pixel unit 122 and the display pixel unit 124 each respectively include the filter patterns in the first unit regions U1 and the second unit regions U2, and the display pixel unit 122 and the display pixel unit 124 share the first white filter pattern W1 or the second white filter pattern W2.

Figure 4:
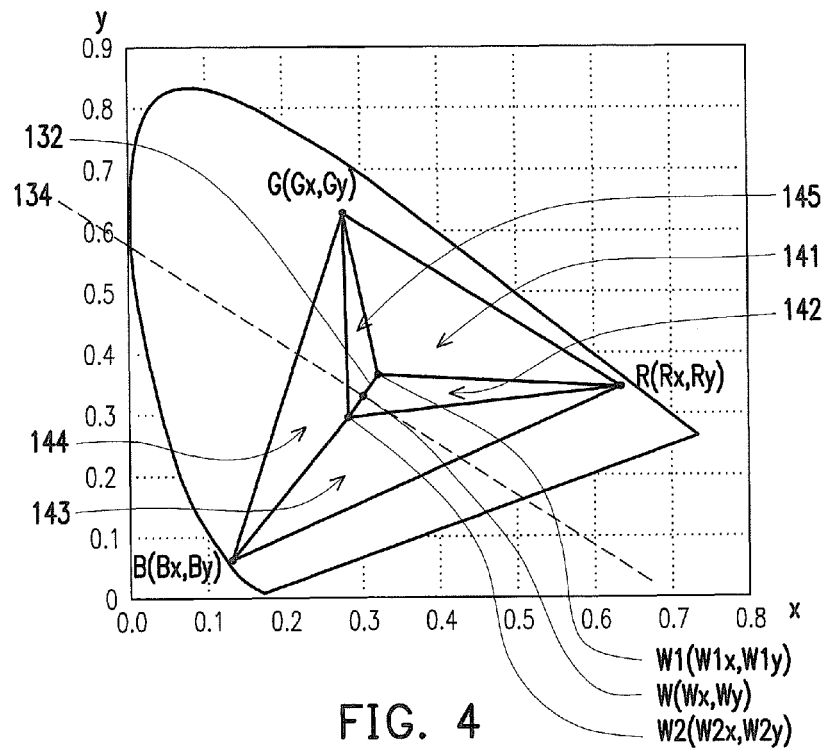
FIG. 4 is a CIE 1931 chromaticity diagram of the display panel provided in the invention.

FIG. 4 is a CIE 1931 chromaticity diagram of the display panel 50 provided in the invention. Please refer to FIG. 4, a white light (namely, the white light emitted by the white organic light emitting units 112 of the pixel array layer 110) has a red light CIE color coordinate (Rx, Ry) after passing through the red filter pattern R, the white light has a green light CIE color coordinate (Gx, Gy) after passing through the green filter pattern G, the white light has a blue light CIE color coordinate (Bx, By) after passing through the blue filter pattern B, the white light has a first white light CIE color coordinate (W1x, W1y) after passing through the first white filter pattern W1, and the white light has a second white light CIE color coordinate (W2x, W2y) after passing through the second white filter pattern W2. A display white point W of the display panel 50 has a display white light CIE color coordinate (Wx, Wy). Moreover, the first white light CIE color coordinate (W1x, W1y) and the display white light CIE color coordinate (Wx, Wy) have a reference line 132 in between. In addition, a standard line 134 is perpendicular to the reference line 12 and passes through the display white point CIE color coordinate (Wx, Wy). The second white light CIE color coordinate (W2x, W2y) is located between the standard line 134 and the blue light CIE color coordinate (Bx, By) of the white light which passes through the blue filter pattern B.

Since the color filter layer 120 in the invention includes five types of color filter patterns, the white light can form five color light display ranges after passing through the color filter layer 120. The red light CIE color coordinate (Rx, Ry), the green light CIE color coordinate (Gx, Gy), and the first white light CIE color coordinate (W1x, W1y) form a first color light display range 141 in between. The red light CIE color coordinate (Rx, Ry), the first white light CIE color coordinate (W1x, W1y), and the second white light CIE color coordinate (W2x, W2y) form a second color light display range 142 in between. The red light CIE color coordinate (Rx, Ry), the second white light CIE color coordinate (W2x, W2y), and the blue light CIE color coordinates (Bx, By) form a third color light display range 143 in between. The blue light CIE color coordinate (Bx, By), the green light CIE color coordinate (Gx, Gy), and the second white light CIE color coordinate (W2x, W2y) form a fourth color light display range 144 in between. The green light CIE color coordinate (Gx, Gy), the first white light CIE color coordinate (W1x, W1y), and the second white light CIE color coordinate (W2x, W2y) form a fifth color light display range 145 in between.

In addition, in the invention, the first white light CIE color coordinate (W1x, W1y) of the white light which passes through the first white filter pattern W1 is different from the second white light CIE color coordinate (W2x, W2y) of the white light which passes through the second white filter pattern W2. Moreover, the first white light CIE color coordinate (W1x, W1y) has higher white light efficiency compared to the display white light CIE color coordinate (Wx, Wy), and the second white light CIE color coordinate (W2x, W2y) has lower white light efficiency compared to the display white light CIE color coordinate (Wx, Wy).

Since the dual W-RGB design of the color filter layer 120 in the invention includes the first white filter patterns W1 having high white point luminous efficiency and the second white filter patterns W2 configured to balance the white point color temperature, the display panel 50 would yield high luminous efficiency in the unsaturated color interval to further achieve the effect of power saving.

More specifically, the invention uses the first white filter pattern W1 and the second white filter pattern W2 to define a display white point W, wherein the first white filter pattern W1 is a high efficiency white point with high luminous efficiency, and the second white filter pattern W2 is a color correction point of the high efficiency white point with lower luminous efficiency. For example, the first white filter pattern W1 can be a transparent filter pattern or a colored filter pattern (the colored filter pattern would decrease the luminous efficiency), and the second white filter pattern W2 can be a colored filter pattern in order to deliver color correction. In the present embodiment, the first white filter pattern W1 is preferred to include transparent material, and the second white filter pattern W2 is preferred to include yellow light absorbing material (namely, the material which appears as light blue and the chromaticity would shift toward the high color temperature direction).

Various color blending examples utilizing five types of color filter patterns (the red filter patterns R, the green filter patterns G, the blue filter patterns B, the first white filter patterns W1, and the second white filter patterns W2) in color filter layer 120 with the pixel array layer 110 (white pixel unit) will be described in detail in the following paragraphs. In FIG. 5 through FIG. 10, the identical or similar components as in the aforementioned FIG. 2 are denoted with the same or similar reference numerals, and repeated description of the same technical contents is omitted. In FIG. 5 through FIG. 10, the area represented by a dashed box indicates that the corresponding white organic light emitting unit 112 is not turned on.

Figure 5:
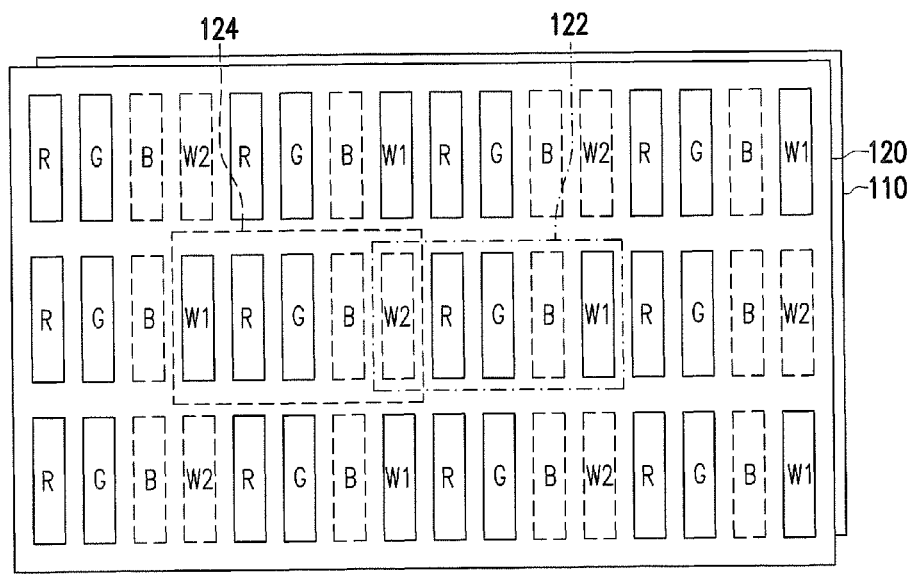
FIG. 5 through FIG. 10 are various color blending examples utilizing five types of color filter patterns in color filter layer respectively.

Please refer to FIG. 5, the display panel 50 includes a plurality of display pixel units 122 and a plurality of display pixel units 124. In each of the display pixel units 122 or each of the display pixel units 124, the filter patterns that the white light passes through are the red filter pattern R, the green filter pattern G, and the first white filter pattern W1. Therefore, in FIG. 5, the display panel 50 could display yellow color (namely, the display panel would display the first color light range 141) after light blending through these filter patterns. In addition, in the present embodiment, since the white organic light emitting unit 112 corresponding to the area represented by the dashed box is not turned on, the filter patterns that have no white light passes through (namely, no luminous) are the blue filter pattern B and the second white filter pattern W2.

Figure 6:
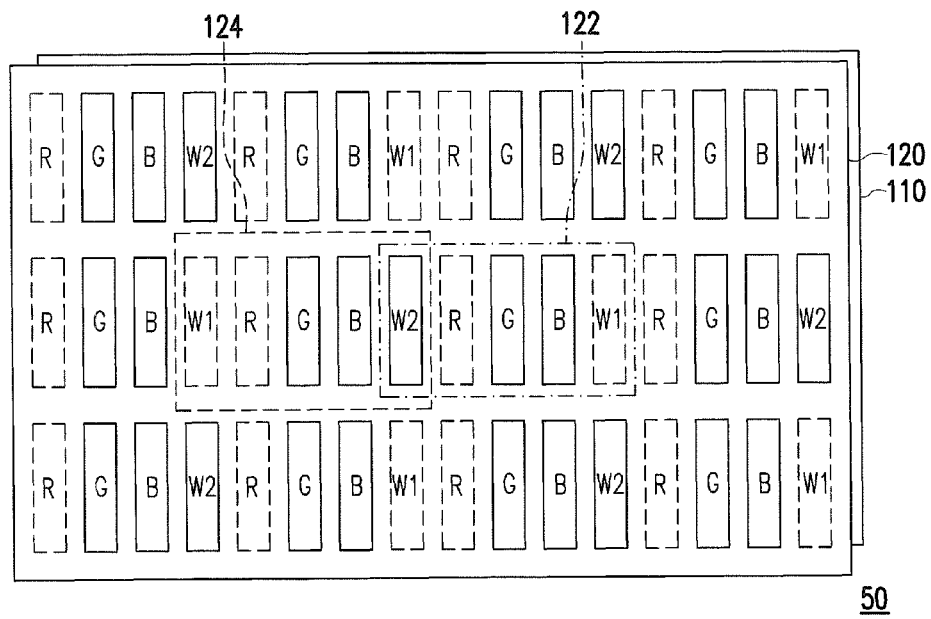

Please refer to FIG. 6, the display panel 50 includes the plurality of display pixel units 122 and the plurality of display pixel units 124. In each of the display pixel units 122 or each of the display pixel units 124, the filter patterns that the white light had passed through are the green filter pattern G, the blue filter pattern B, and the second white filter pattern W2. Therefore, in FIG. 6, the display panel 50 could display teal color (namely, the display panel would display the fourth color light range 144) after light blending through these filter patterns. In addition, in the present embodiment, since the white organic light emitting unit 112 corresponding to the area represented by the dashed box is not turned on, the filter patterns that have no white light passes through (namely, no luminous) are the red filter pattern R and the first white filter pattern W1.

Figure 7:
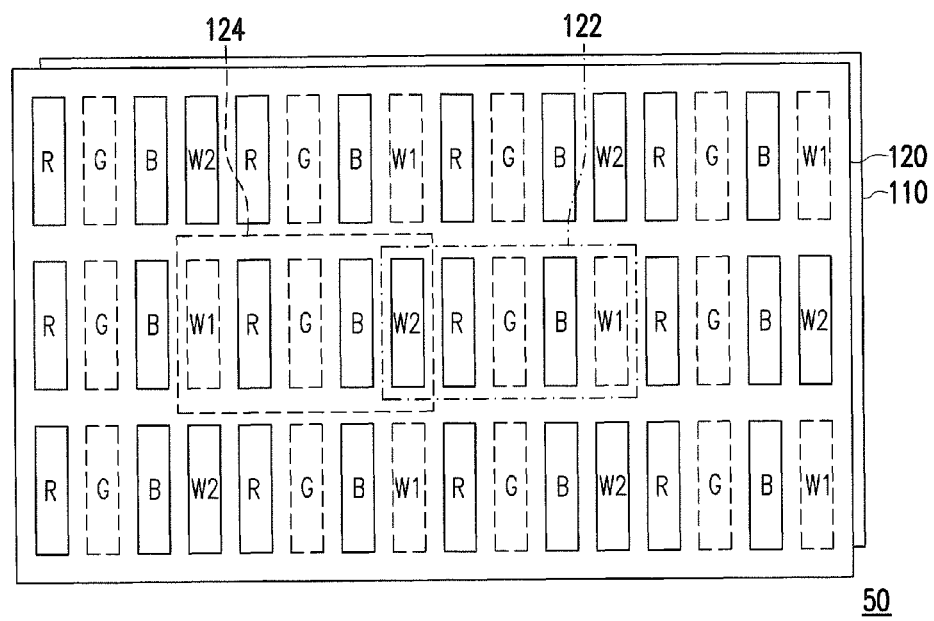

Please refer to FIG. 7, the display panel 50 includes the plurality of display pixel units 122 and the plurality of display pixel units 124. In each of the display pixel units 122 or each of the display pixel units 124, the filter patterns that the white light had passed through are the red filter pattern R, the blue filter pattern B, and the second white filter pattern W2. Therefore, in FIG. 7, the display panel 50 could display purple color (namely, the display panel would display the third color light range 143) after light blending through these filter patterns. In addition, in the present embodiment, since the white organic light emitting unit 112 corresponding to the area represented by the dashed box is not turned on, the filter patterns that have no white light passes through (namely, no luminous) are the green filter pattern G and the first white filter pattern W1.

Figure 8:
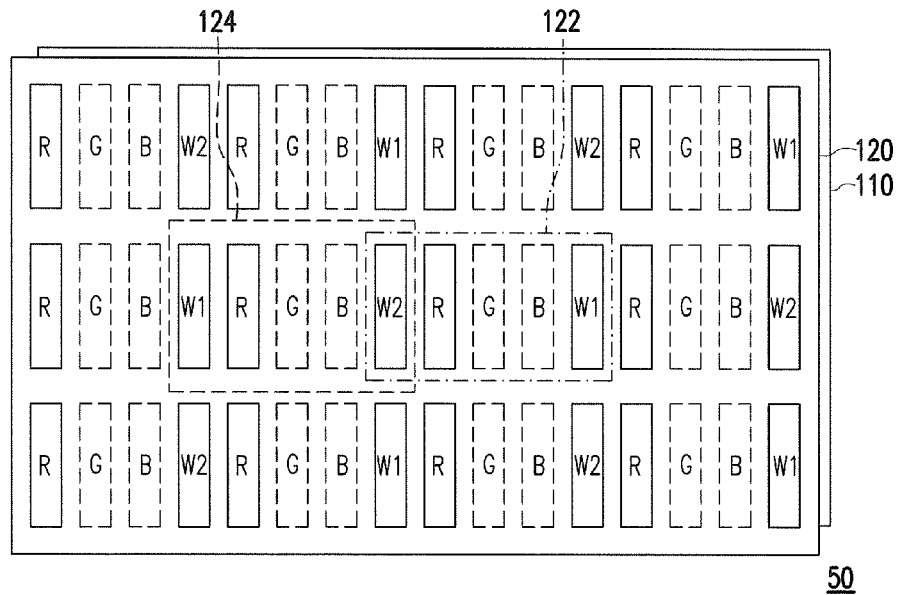

Please refer to FIG. 8, the display panel 50 includes the plurality of display pixel units 122 and the plurality of display pixel units 124. In each of the display pixel units 122 or each of the display pixel units 124, the filter patterns that the white light had passed through are the red filter pattern R, the first white filter pattern W1, and the second white filter pattern W2. Therefore, in FIG. 8, the display panel 50 could display orange color (namely, the display panel would display the second color light range 142) after light blending through these filter patterns. In addition, in the present embodiment, since the white organic light emitting unit 112 corresponding to the area represented by the dashed box is not turned on, the filter patterns that have no white light passes through (namely, no luminous) are the green filter pattern G and the blue filter pattern B.

Figure 9:
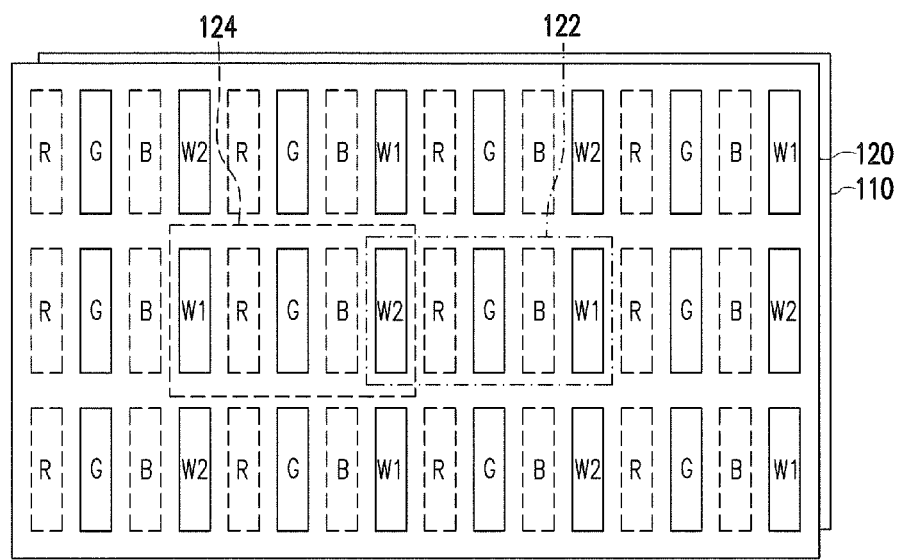

Please refer to FIG. 9, wherein the display panel 50 includes the plurality of display pixel units 122 and the plurality of display pixel units 124. In each of the display pixel units 122 or each of the display pixel units 124, the filter patterns that the white light had passed through are the green filter pattern G, the first white filter pattern W1, and the second white filter pattern W2, wherein only small amount of the white light had passed through the green filter pattern G. Therefore, in FIG. 9, the display panel 50 could display white color (namely, the display panel would display the fifth color light display range 145) after light blending through these filter patterns. In addition, in the present embodiment, since the white organic light emitting unit 112 corresponding to the area represented by the dashed box is not turned on, the filter patterns that have no white light passes through (namely, no luminous) are the red filter pattern R and the blue filter pattern B. However, the discussion herein construes no limitation in the invention. In other embodiments, the filter patterns that the white light had passed through can also be the blue filter pattern B, the first white filter pattern W1, and the second white filter pattern W2, wherein only small amount of the white light had passed through the blue filter pattern B. Therefore, the display panel could display white color after light blending through these filter patterns.

Figure 10:
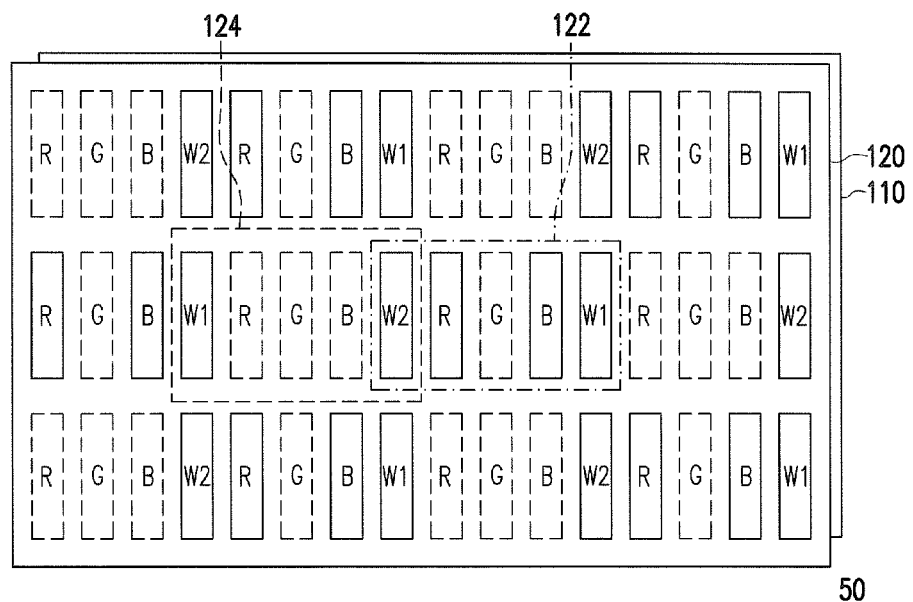

Please refer to FIG. 10, the display panel 50 includes the plurality of display pixel units 122 and the plurality of display pixel units 124. In each of the display pixel units 122 or each of the display pixel units 124, the filter patterns that the white light had passed through are the red filter pattern R, the blue filter pattern B, the first white filter pattern W1, and the second white filter pattern W2, wherein only small amount of the white light had passed through the red filter pattern R and the blue filter pattern B. Therefore, in FIG. 10, the display panel 50 could display white color after light blending through these filter patterns. In addition, in the present embodiment, since the white organic light emitting unit 112 corresponding to the area represented by the dashed box is not turned on, the filter patterns that have no white light passes through (namely, no luminous) are the red filter pattern R, the green filter pattern G, and the blue filter pattern B.

In addition, when the display panel 50 displays non-black, non-pure red, non-pure green, and non-pure blue, the white light passes through the first white filter pattern W1. Moreover, when the display panel 50 displays the first color light display range 141, the white light does not pass through the second white filter pattern 142.

In addition, in the examples according to the aforementioned FIG. 5 through FIG. 10, the display panel 50 of the invention can increase the luminous efficiency in the unsaturated color interval by dual W-RGB algorithm and can deliver compensation of intensity and color of the white point color and the surrounding filter patterns in order to generate better white point color or other special colors. Therefore, the display panel 50 which utilizes dual W-RGB algorithm in the invention can include advantages such as having resolution that does not sacrifice any color, correct color, high light color stability, high image brightness, low power, low total current, low current density, and so on.

Furthermore, in order to prove the display panel 50 which utilizes dual W-RGB algorithm in the invention can achieve the effect of power saving, a chromaticity simulation experiment had been delivered. In the chromaticity simulation experiment, the experimental examples are the display panel 50 (namely, dual W-RGB OLED display panel) according to first embodiment (as shown in FIG. 1 through FIG. 3B) of the invention, and the comparative examples are the traditional red, green, blue, and white four colors display panel (namely, W-RGB OLED display panel). Through this chromaticity simulation experiment, it is known that the dual W-RGB algorithm display panel 50 utilized in the invention saves about 20% of the power consumption compared to the traditional W-RGB OLED display panel.

In the aforementioned embodiments according to FIG. 2 through FIG. 3B, the plurality of filter patterns of the color filter layer 120 are arranged in the form of strip with single row and multiple columns as an example for demonstration. However, it construes no limitation in the invention. In other embodiment of the invention (for example, as shown in second embodiment according to FIG. 11 through FIG. 12B), the plurality of filter patterns of the color filter layer 120 can also be arranged in the form of delta, mosaic, or other suitable arrangements.

Figure 11:
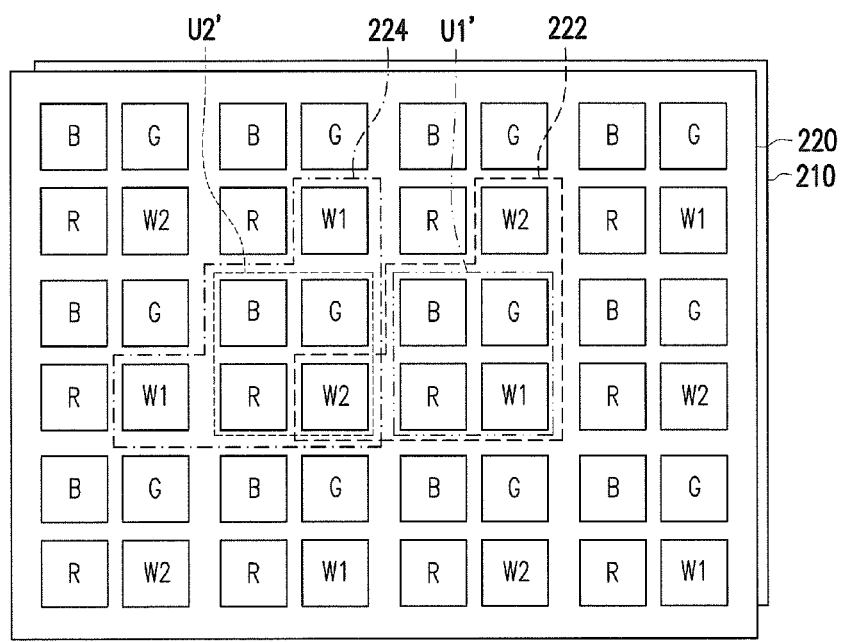
FIG. 11 is a schematic top view of a display panel according to second embodiment of the invention.
Figure 12A:
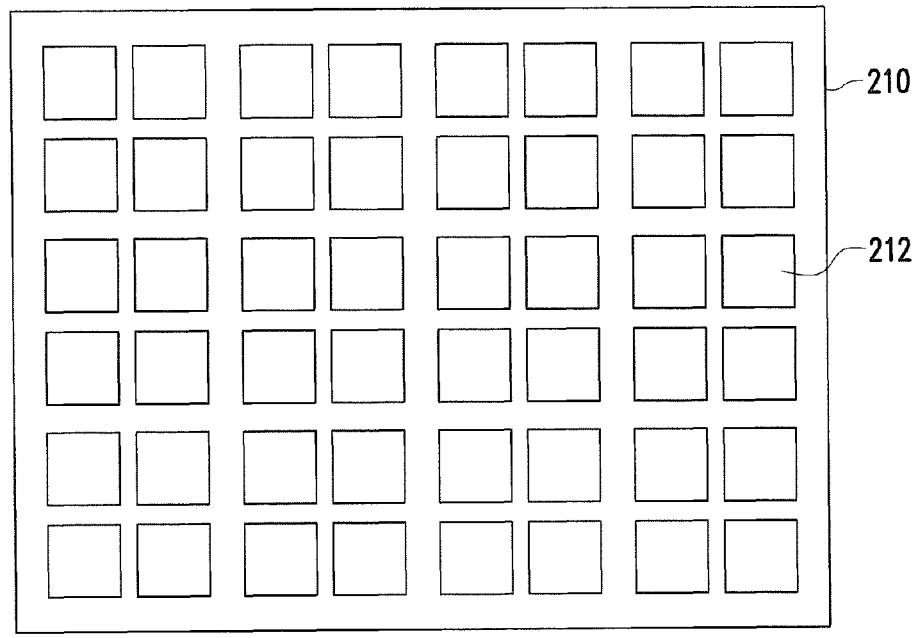
FIG. 12A is a schematic top view of a pixel array layer according to second embodiment of the invention.
Figure 12B:
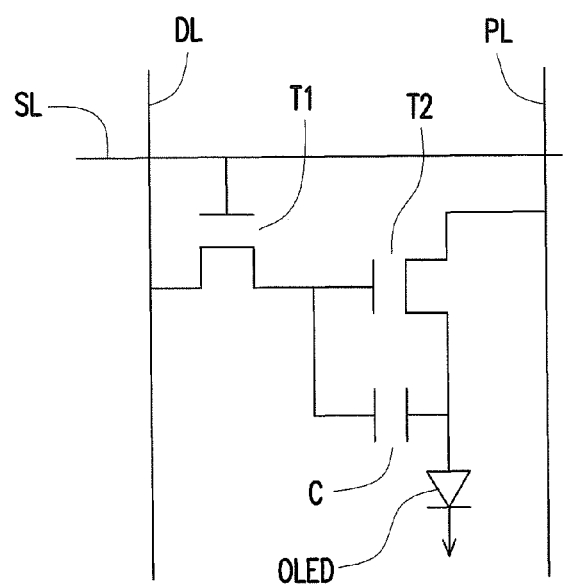
FIG. 12B is an equivalent circuit diagram of a light emitting unit in the pixel array layer shown in FIG. 12A.

FIG. 11 is a schematic top view of a display panel according to second embodiment of the invention. FIG. 12A and FIG. 12B are respectively a schematic top view of a pixel array and an equivalent circuit diagram of a light emitting unit (namely, the white organic light emitting unit 212) in the pixel array layer according to second embodiment of the invention. The embodiment corresponding to FIG. 11 through FIG. 12B is similar to the aforementioned embodiment corresponding to FIG. 2 through FIG. 3B, so the identical or similar components are denoted with the same or similar reference numerals, and repeated description of the same technical contents is omitted. The embodiment corresponding to FIG. 11 through FIG. 12B and the aforementioned embodiment corresponding to FIG. 2 through FIG. 3B are different in the arrangements and shapes of the plurality of white organic light emitting units 212 of the pixel array layer 210 and the plurality of filter patterns of the color filter layer 220.

More specifically, in a display panel 60 of the present embodiment, the red filter pattern R, the green filter pattern G, the blue filter pattern B, and the first white filter pattern W1 in each of the first unit regions U1' are arranged in the form of two rows with two columns, and the red filter pattern R, the green filter pattern G, the blue filter pattern B, and the second white filter pattern W2 in each of the second unit regions U2' are arranged in the form of two rows with two columns. The red filter pattern R, the green filter pattern G, the blue filter pattern B, and the first white filter pattern W1 or the second white filter pattern W2 are arranged, for example, in the form of 2×2 matrix (namely, in the form of quad), and the shapes of these filter patterns are, for example, rectangle, square, oblong, or other suitable shapes.

Moreover, in the present embodiment, the red filter pattern R, the green filter pattern G, the blue filter pattern B, and the first white filter pattern W1 in each of the first unit regions U1' and adjacent two second white filter patterns W2 in the two second unit regions U2' form a display pixel unit 222, and the red filter pattern R, the green filter pattern G, the blue filter pattern B, and the second white filter pattern W2 in each of the second unit regions U2' and adjacent two first white filter patterns W1 in the two first unit regions U1' form another display pixel unit 224. In other words, the display pixel unit 222 and the display pixel unit 224 each respectively include the filter patterns in the first unit regions U1' and the second unit regions U2', and the display pixel unit 222 and the display pixel unit 224 share a first white filter pattern W1 or a second white filter pattern W2.

Figure 13:
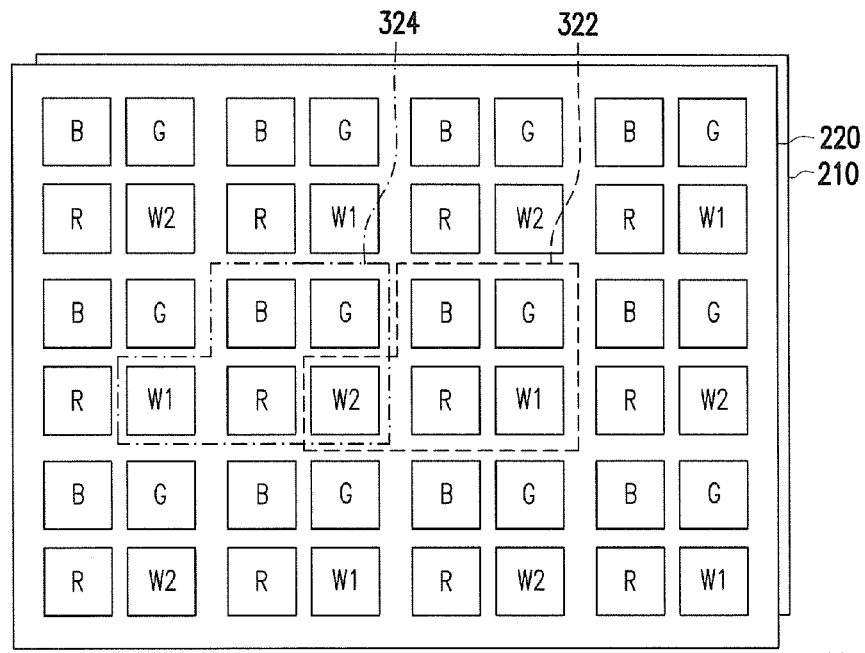
FIG. 13 through FIG. 15 are various color blending examples utilizing five types of color filter patterns in color filter layer respectively.
Figure 14:
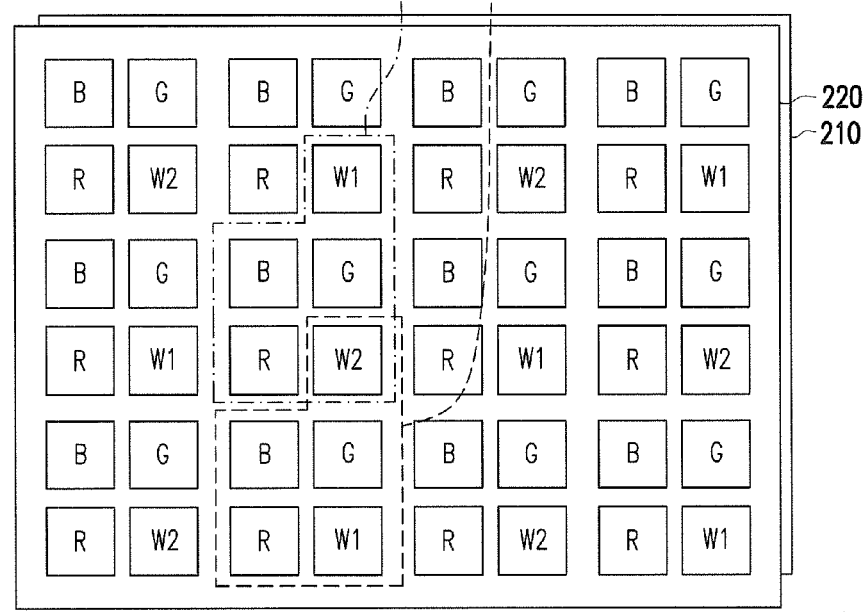
Figure 15:
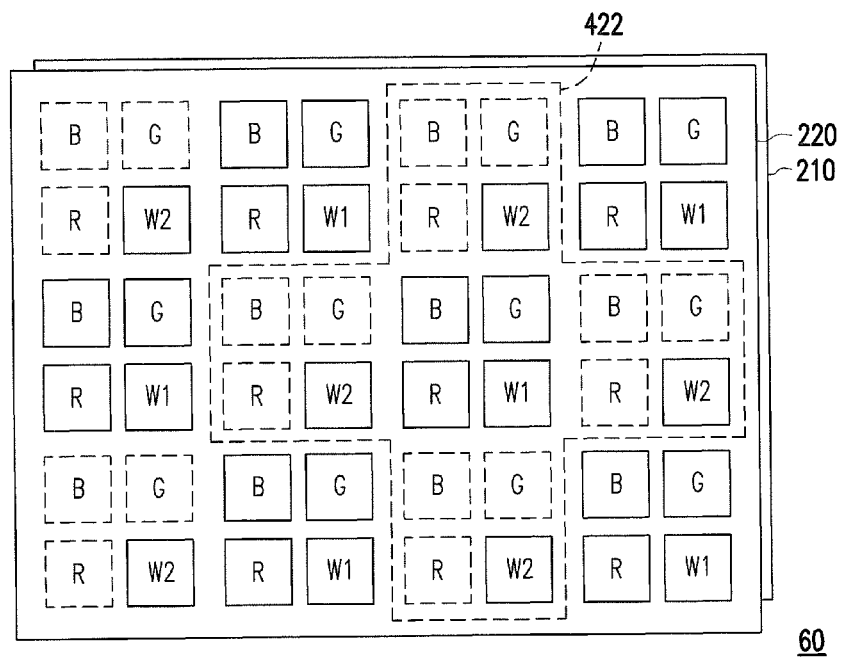

Various examples of other display pixel unit arrangements utilizing five types of color filter patterns (the red filter patterns R, the green filter patterns G, the blue filter patterns B, the first white filter patterns W1, and the second white filter patterns W2) in color filter layer 220 with the pixel array layer 210 (white pixel unit) will be described in detail in the following paragraphs. In FIG. 13 through FIG. 15, the identical or similar components as in the aforementioned FIG. 11 are denoted with the same or similar reference numerals, and repeated description of the same technical contents is omitted.

Referring to FIG. 13, the display panel 60 includes a plurality of display pixel unit 322 and a plurality of display pixel unit 324. The red filter pattern R, the green filter pattern G, the blue filter pattern B, and the first white filter pattern W1 in each of the first unit regions U1' and one adjacent second white filter pattern W2 in one second unit region U2' form the display pixel unit 322, and the red filter pattern R, the green filter pattern G, the blue filter pattern B, and the second white filter pattern W2 in each of the second unit regions U2' and one adjacent first white filter pattern W1 in one first unit region U1 form another display pixel unit 324.

Referring to FIG. 14, the display panel 60 includes a plurality of display pixel unit 322' and a plurality of display pixel unit 324'. The red filter pattern R, the green filter pattern G, the blue filter pattern B, and the first white filter pattern W1 in each of the first unit regions U1' and one adjacent second white filter pattern W2 in one second unit region U2' form the display pixel unit 322', and the red filter pattern R, the green filter pattern G, the blue filter pattern B, and the second white filter pattern W2 in each of the second unit regions U2' and one adjacent first white filter pattern W1 in one first unit region U1' form another display pixel unit 324'. The display pixel unit of the display panel 60 in FIG. 14 and the display pixel unit of the display panel 60 in FIG. 13 are different in the location of the aforementioned adjacent second white filter pattern W2 or the aforementioned adjacent first white filter pattern W1.

Referring to FIG. 15, the display panel 60 includes a plurality of display pixel unit 422. The red filter pattern R, the green filter pattern G, the blue filter pattern B, and the first white filter pattern W1 in each of the first unit regions U1' and four adjacent second white filter patterns W2 in four second unit regions U2' form the display pixel unit 422. In FIG. 15, the filter pattern represented by the dashed box indicates the filter pattern which has no white light passes through; namely, the corresponding white organic light emitting unit 212 of the pixel array layer 210 is not turned on and does not provide white light source. Therefore, in the present embodiment, the filter patterns that have no white light passes through (namely, no luminous) are the red filter pattern R, the green filter pattern G, and the blue filter pattern B.

In addition, the luminous efficiency of the two adjacent second white filter patterns W2 or first white filter patterns W1 in each of the display pixel unit shown in FIG. 11 is half of the luminous efficiency of the one adjacent second white filter pattern W2 or first white filter pattern W1 in each of the display pixel unit shown in FIG. 13 (or FIG. 14). Similarly, the luminous efficiency of the four adjacent second white filter patterns W2 or first white filter patterns W1 in each of the display pixel unit shown in FIG. 15 is one fourth of the luminous efficiency of the one adjacent second white filter pattern W2 or first white filter pattern W1 in each of the display pixel unit shown in FIG. 13 (or FIG. 14). In other words, in the present embodiment, the first white light CIE color coordinate (W1x, W1y) also need to maintain higher white light efficiency compared to the display white light CIE color coordinate (Wx, Wy), and the second white light CIE color coordinate (W2x, W2y) has lower white light efficiency compared to the display white light CIE color coordinate (Wx, Wy).

Figure 16:
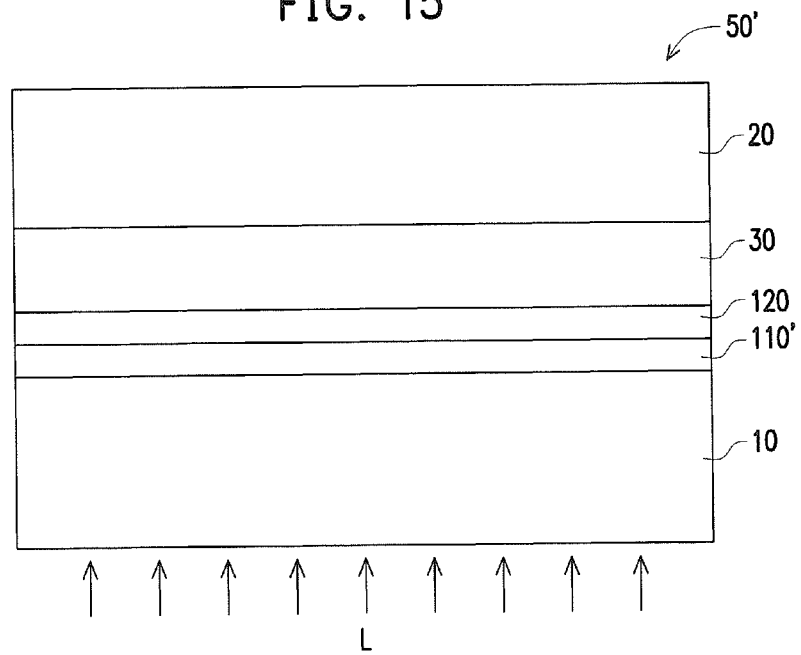
FIG. 16 is a schematic cross-sectional view of a display panel according to another embodiment of the invention.

FIG. 16 is a schematic cross-sectional view of a display panel according to another embodiment of the invention. The embodiment according to FIG. 16 is similar to the embodiment according to FIG. 1, so the identical or similar components are denoted with the same or similar reference numerals, and repeated description of the same technical contents is omitted. The difference between the embodiment according to FIG. 16 and the embodiment according to FIG. 1 is that a display panel 50' is a non self-illuminating display panel. The example of the non self-illuminating display panel includes liquid crystal display panel. The display panel 50' includes a light source L, a substrate 10, a pixel array layer 110', a color filter layer 120, a substrate 20, and a display medium 30. The light source L emits white light. The light source L is, for example, a back light source, and the back light source includes Cold-Cathode Fluorescent Lamp (CCFL) back light source or Light Emitting Diode (LED) back light source. The pixel array layer 110' is disposed on the light source L, and the pixel array layer 110' is, for example, formed by a plurality of pixel structures. The material of the substrate 20 is, for example, glass, quartz, organic polymer, metal, or the like. The display medium 30 is located between the substrate 10 and the substrate 20. When the display panel 50' is the liquid crystal display, the display medium 30 is, for example, liquid crystal molecules.

Accordingly, in the display panel provided in the invention, the color filter layer includes a plurality of red filter patterns, a plurality of green filter patterns, a plurality of blue filter patterns, a plurality of first white filter patterns, and a plurality of second white filter patterns disposed corresponding to the pixel array layer, wherein the first white light CIE color coordinate of the white light which passes through the first white filter pattern is different from the second white light CIE color coordinate of the white light which passes through the second white filter pattern. Since the display provided in the invention has the first and the second white filter patterns including different white light CIE color coordinates and five types of color filter patterns containing three primary colors RGB, the display would yield high luminous efficiency in the unsaturated color interval to further achieve the effect of power saving.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A display panel having a plurality of first unit regions and a plurality of second unit regions, wherein the first unit regions and the second unit regions are staggered to each other, and the display panel comprises:

a pixel array layer comprising a plurality of white organic light emitting units which generate a white light; and a color filter layer, located on the pixel array layer, and the color filter layer comprising a plurality of red filter patterns, a plurality of green filter patterns, a plurality of blue filter patterns, a plurality of first white filter patterns, and a plurality of second white filter patterns disposed corresponding to the pixel array layer, wherein a first white light CIE color coordinate of the white light which passes through the first white filter pattern is different from a second white light CIE color coordinate of the white light which passes through the second white filter pattern, each of the first unit regions has one red filter pattern, one green filter pattern, one blue filter pattern, and one first white filter pattern disposed therein, and each of the second unit regions has one red filter pattern, one green filter pattern, one blue filter pattern, and one second white filter pattern disposed therein.

2. The display panel according to claim 1, wherein the red filter pattern, the green filter pattern, the blue filter pattern, and the first white filter pattern in each of the first unit regions are arranged in the form of single row with multiple columns, and the red filter pattern, the green filter pattern, the blue filter pattern, and the second white filter pattern in each of the second unit regions are arranged in the form of single row with multiple columns.

3. The display panel according to claim 2, wherein the red filter pattern, the green filter pattern, the blue filter pattern, and the first white filter pattern in each of the first unit regions and an adjacent second white filter pattern in the second unit region form a display pixel unit;

the red filter pattern, the green filter pattern, the blue filter pattern, and the second white filter pattern in each of the second unit regions and an adjacent first white filter pattern in the first unit region form another display pixel unit; and the display pixel unit and the another display pixel unit share the first white filter pattern or the second white filter pattern.

4. The display panel according to claim 1, wherein the red filter pattern, the green filter pattern, the blue filter pattern, and the first white filter pattern in each of the first unit regions are arranged in the form of two rows with two columns, and the red filter pattern, the green filter pattern, the blue filter pattern, and the second white filter pattern in each of the second unit regions are arranged in the form of two rows with two columns.

5. The display panel according to claim 4, wherein the red filter pattern, the green filter pattern, the blue filter pattern, and the first white filter pattern in each of the first unit regions and adjacent two second white filter patterns in the two second unit regions form a display pixel unit;

the red filter pattern, the green filter pattern, the blue filter pattern, and the second white filter pattern in each of the second unit regions and adjacent two first white filter patterns in the two first unit regions form another display pixel unit; and the display pixel unit and the another display pixel unit share one first white filter pattern or one second white filter pattern.

6. The display panel according to claim 1, wherein a display white point of the display panel has a display white light CIE color coordinate, the first white light CIE color coordinate has higher white light efficiency compared to the display white light CIE color coordinate, and the second white light CIE color coordinate has lower white light efficiency compared to the display white light CIE color coordinate.

7. The display panel according to claim 6, wherein the plurality of first white filter pattern comprises a transparent material and the plurality of second white filter pattern comprises a yellow light absorbing material.

8. The display panel according to claim 1, wherein the first white light CIE color coordinate and the display white light CIE color coordinate have a reference line in between, a standard line is perpendicular to the reference line and passes through the display white point CIE color coordinate, and the second white light CIE color coordinate is located between the standard line and a blue CIE color coordinate of the white light which passes through the blue filter pattern.

9. The display panel according to claim 1, wherein
the white light has a red light CIE color coordinate after passing through the red filter pattern, the white light has a green light CIE color coordinate after passing through the green filter pattern, the white light has a blue light CIE color coordinate after passing through the blue filter pattern;

the red light CIE color coordinate, the green light CIE color coordinate, and the first white light CIE color coordinate form a first color light display range in between;

the red light CIE color coordinate, the first white light CIE color coordinate, and the second white light CIE color coordinate form a second color light display range in between;

the red light CIE color coordinate, the second white light CIE color coordinate, and the blue light CIE color coordinate form a third color light display range in between;

the blue light CIE color coordinate, the green light CIE color coordinate, and the second white light CIE color coordinate form a fourth color light display range in between; and the green light CIE color coordinate, the first white light CIE color coordinate, and the second white light CIE color coordinate form a fifth color light display range in between.

10. The display panel according to claim 9, wherein when the display panel displays non-black, non-pure red, non-pure green, or non-pure blue, the white light passes through the plurality of first white filter patterns.

11. The display panel according to claim 1, wherein when the display panel displays non-black, non-pure red, non-pure green, or non-pure blue, the white light passes through the plurality of first white filter patterns.

12. The display panel according to claim 11, wherein when the display panel displays the first color light display range, the white light does not pass through the plurality of second white filter patterns.

13. A display panel having a plurality of first unit regions and a plurality of second unit regions, wherein the first unit regions and the second unit regions are staggered to each other, and the display panel comprises:

a light source, displaying a white light;

a pixel array layer, disposed on the light source; and a color filter layer, located on the pixel array layer, and the color filter layer comprising a plurality of red filter patterns, a plurality of green filter patterns, a plurality of blue filter patterns, a plurality of first white filter patterns, and a plurality of second white filter patterns disposed corresponding to the pixel array layer, wherein a first white light CIE color coordinate of the white light which passes through the first white filter pattern is different from a second white light CIE color coordinate of the white light which passes through the second white filter pattern, and one red filter pattern, one green filter pattern, one blue filter pattern, and one first white filter pattern are disposed in each of the first unit regions, and one red filter pattern, one green filter pattern, one blue filter pattern, and one second white filter pattern are disposed in each of the second unit regions.

14. The display panel according to claim 13, wherein the red filter pattern, the green filter pattern, the blue filter pattern, and the first white filter pattern in each of the first unit regions are arranged in the form of single row with multiple columns, and the red filter pattern, the green filter pattern, the blue filter pattern, and the second white filter pattern in each of the second unit regions are arranged in the form of single row with multiple columns.

15. The display panel according to claim 14, wherein the red filter pattern, the green filter pattern, the blue filter pattern, and the first white filter pattern in each of the first unit regions and an adjacent second white filter pattern in the second unit region form a display pixel unit;
the red filter pattern, the green filter pattern, the blue filter pattern, and the second white filter pattern in each of the second unit regions and an adjacent first white filter pattern in the first unit region form another display pixel unit; and
the display pixel unit and the another display pixel unit share the first white filter pattern or the second white filter pattern.

16. The display panel according to claim 13, wherein the red filter pattern, the green filter pattern, the blue filter pattern, and the first white filter pattern in each of the first unit regions are arranged in the form of two rows with two columns, and the red filter pattern, the green filter pattern, the blue filter pattern, and the second white filter pattern in each of the second unit regions are arranged in the form of two rows with two columns.

17. The display panel according to claim 16, wherein the red filter pattern, the green filter pattern, the blue filter pattern, and the first white filter pattern in each of the first unit regions and adjacent two second white filter patterns in the two second unit regions form a display pixel unit;
the red filter pattern, the green filter pattern, the blue filter pattern, and the second white filter pattern in each of the second unit regions and adjacent two first white filter patterns in the two first unit regions form another display pixel unit; and
the display pixel unit and the another display pixel unit share one first white filter pattern or one second white filter pattern.

18. The display panel according to claim 13, wherein a display white point of the display panel has a display white light CIE color coordinate, the first white light CIE color coordinate has higher white light efficiency compared to the display white light CIE color coordinate, and the second white light CIE color coordinate has lower white light efficiency compared to the display white light CIE color coordinate.

19. The display panel according to claim 18, wherein the plurality of first white filter pattern comprises a transparent material and the plurality of second white filter pattern comprises a yellow light absorbing material.

20. The display panel according to claim 13, wherein the first white light CIE color coordinate and the display white light CIE color coordinate have a reference line in between, a standard line is perpendicular to the reference line and passes through the display white point CIE color coordinate, and the second white light CIE color coordinate is located between the standard line and a blue CIE color coordinate of the white light which passes through the blue filter pattern.

21. The display panel according to claim 13, wherein
the white light has a red light CIE color coordinate after passing through the red filter pattern, the white light has a green light CIE color coordinate after passing through the green filter pattern, the white light has a blue light CIE color coordinate after passing through the blue filter pattern;
the red light CIE color coordinate, the green light CIE color coordinate, and the first white light CIE color coordinate form a first color light display range in between;
the red light CIE color coordinate, the first white light CIE color coordinate, and the second white light CIE color coordinate form a second color light display range in between;
the red light CIE color coordinate, the second white light CIE color coordinate, and the blue light CIE color coordinate form a third color light display range in between;
the blue light CIE color coordinate, the green light CIE color coordinate, and the second white light CIE color coordinate form a fourth color light display range in between; and
the green light CIE color coordinate, the first white light CIE color coordinate, and the second white light CIE color coordinate form a fifth color light display range in between.

22. The display panel according to claim 13, wherein when the display panel displays non-black, non-pure red, non-pure green, or non-pure blue, the white light passes through the plurality of first white filter patterns.

23. The display panel according to claim 22, wherein when the display panel displays the first color light display range, the white light does not pass through the plurality of second white filter patterns.

* * * * *